US010998188B2

(12) United States Patent
Mishima et al.

(10) Patent No.: US 10,998,188 B2
(45) Date of Patent: May 4, 2021

(54) GALLIUM NITRIDE LAMINATED SUBSTRATE AND SEMICONDUCTOR DEVICE

(71) Applicants: HOSEI UNIVERSITY, Tokyo (JP); SCIOCS COMPANY LIMITED, Ibaraki (JP); SUMITOMO CHEMICAL COMPANY, LIMITED, Tokyo (JP)

(72) Inventors: Tomoyoshi Mishima, Tokyo (JP); Hiroshi Ohta, Tokyo (JP); Fumimasa Horikiri, Ibaraki (JP); Masatomo Shibata, Ibaraki (JP)

(73) Assignees: HOSEI UNIVERSITY, Tokyo (JP); SCIOCS COMPANY LIMITED, Ibaraki (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 188 days.

(21) Appl. No.: 16/403,859

(22) Filed: May 6, 2019

(65) Prior Publication Data

US 2019/0348276 A1     Nov. 14, 2019

(30) Foreign Application Priority Data

May 9, 2018 (JP) .............................. JP2018-090879

(51) Int. Cl.
*H01L 21/00* (2006.01)
*H01L 21/02* (2006.01)
(Continued)

(52) U.S. Cl.
CPC .......... *H01L 21/0254* (2013.01); *C30B 29/38* (2013.01); *C30B 29/406* (2013.01);
(Continued)

(58) Field of Classification Search
CPC ............. H01L 21/0254; H01L 29/2003; H01L 29/402; H01L 29/66136; H01L 29/8613; H01S 5/3202; H01S 5/0213
See application file for complete search history.

(56) References Cited

U.S. PATENT DOCUMENTS 6,353,236 B1    3/2002 Yatsuo et al.
9,917,149 B1*   3/2018 Dickerson ........... H01L 29/8611
(Continued)

FOREIGN PATENT DOCUMENTS

JP    2000-91596 A    3/2000
JP    2000-340807 A   12/2000

*Primary Examiner* — Richard A Booth
(74) *Attorney, Agent, or Firm* — Pearne & Gordon LLP

(57) ABSTRACT

There is provided a gallium nitride laminated substrate including: an n-type gallium nitride layer containing an n-type impurity; a p-type gallium nitride layer provided on the n-type gallium nitride layer, containing a p-type impurity, forming a pn-junction at an interface with the n-type gallium nitride layer, and having a p-type impurity concentration and a thickness such that, when a reverse bias voltage is applied to the pn-junction, a breakdown occurs due to a punchthrough phenomenon before occurrence of a breakdown due to an avalanche phenomenon; and an intermediate level layer provided on the p-type gallium nitride layer, containing a p-type gallium nitride which contains the p-type impurity at a higher concentration than the p-type gallium nitride layer, having at least one or more intermediate levels between a valence band and a conduction band, and configured to suppress an overcurrent resulting from a breakdown due to the punchthrough phenomenon in the p-type gallium nitride layer.

13 Claims, 3 Drawing Sheets

(51) Int. Cl.
    *H01S 5/02*     (2006.01)
    *C30B 29/38*     (2006.01)
    *C30B 29/40*     (2006.01)
    *H01S 5/32*     (2006.01)
    *H01L 29/20*     (2006.01)
    *C30B 25/18*     (2006.01)

(52) U.S. Cl.
    CPC ........ *H01L 29/2003* (2013.01); *H01S 5/0213* (2013.01); *H01S 5/3202* (2013.01); *C30B 25/18* (2013.01)

(56) References Cited

U.S. PATENT DOCUMENTS

| | | | |
|---|---|---|---|
| 2015/0123138 A1* | 5/2015 | Kizilyalli | H01L 21/02458 257/76 |
| 2018/0233591 A1* | 8/2018 | Watanabe | H01L 29/7802 |
| 2020/0127101 A1* | 4/2020 | Narita | H01L 29/402 |

* cited by examiner

GALLIUM NITRIDE LAMINATED SUBSTRATE AND SEMICONDUCTOR DEVICE

BACKGROUND

Technical Field

The present invention relates to a gallium nitride laminated substrate and a semiconductor device.

Description of Related Art

A semiconductor device having a pn-junction such as a diode or a transistor may be fabricated, for example, using a group-III nitride laminate substrate in which an n-type or p-type group-III nitride crystal film (hereinafter also referred to as epi-layer) is epitaxially grown on a group-III nitride substrate.

In a semiconductor device having a pn-j unction, when an excessive voltage is applied to the pn-junction in a reverse direction, an avalanche phenomenon occurs resulting in an increased reverse voltage, and thus a breakdown occurs due to the avalanche phenomenon (avalanche breakdown) in some cases. As a result of the avalanche breakdown, the semiconductor device will experience an electrical breakdown. Accordingly, in a laminate substrate used for the semiconductor device, it is required to improve reverse breakdown voltage characteristics from a viewpoint of suppressing the electric breakdown due to the reverse bias voltage.

As a method of improving the reverse breakdown voltage characteristics, for example, Patent Documents 1 and 2 disclose that an impurity concentration or a thickness of a p-type epi-layer is adjusted so that a punchthrough phenomenon occurs at a voltage lower than a voltage at which an avalanche breakdown occurs in a laminate substrate having an epi-layer formed on a Si substrate or a SiC substrate. In this method, when the reverse bias voltage is applied to a semiconductor device, a voltage can be reduced by punchthrough before the semiconductor device experiences an electrical breakdown due to the avalanche breakdown. Therefore the electrical breakdown can be suppressed.

RELATED ART DOCUMENT

Patent Documents

[Patent Document 1] Japanese Unexamined Patent Application Publication No. 2000-340807
[Patent Document 2] Japanese Unexamined Patent Application Publication No. 2000-91596

BRIEF SUMMARY OF THE INVENTION

Problem to be Solved by the Invention

From the viewpoint of improving device characteristics in the semiconductor device, the inventors of the present invention study use of a laminate substrate containing group-Ill nitride, especially gallium nitride (GaN).

After study by the inventors of the present invention, it is found that since a GaN laminate substrate is configured so that a breakdown occurs due to a punchthrough phenomenon before an electrical breakdown occurs due to an avalanche breakdown, an electrical breakdown due to the avalanche breakdown in a semiconductor device can be avoided.

However, in a case of the GaN laminate substrate, it is confirmed that when a reverse bias voltage is repeatedly applied, a semiconductor device is more likely to be damaged compared to a Si laminate substrate or a SiC laminate substrate. In other words, it was found that a durability of a device tends to be low.

An object of the present invention is to provide a gallium nitride laminated substrate capable of fabricating a semiconductor device which suppresses an electrical breakdown due to an avalanche breakdown and has an excellent durability.

Means to Solve the Problem

According to an aspect of the present invention,
there is provided a gallium nitride laminated substrate including:
an n-type gallium nitride layer containing an n-type impurity;
a p-type gallium nitride layer provided on the n-type gallium nitride layer, containing a p-type impurity, forming a pn-junction at an interface with the n-type gallium nitride layer, and having a p-type impurity concentration and a thickness such that, when a reverse bias voltage is applied to the pn-junction, a breakdown occurs due to a punchthrough phenomenon before occurrence of a breakdown due to an avalanche phenomenon; and
an intermediate level layer provided on the Hype gallium nitride layer, containing a p-type gallium nitride which contains the p-type impurity at a higher concentration than the p-type gallium nitride layer, having at least one or more intermediate levels between a valence band and a conduction band, and configured to suppress an overcurrent resulting from a breakdown due to the punchthrough phenomenon in the p-type gallium nitride layer.

According to another aspect of the present invention,
there is provided a semiconductor device including:
an n-type gallium nitride layer containing an n-type impurity;
a p-type gallium nitride layer provided on the n-type gallium nitride layer, containing a p-type impurity, forming a pn-junction at an interface with the n-type gallium nitride layer, and having a p-type impurity concentration and a thickness such that, when a reverse bias voltage is applied to the pn-junction, a breakdown occurs due to a punchthrough phenomenon before occurrence of a breakdown due to an avalanche phenomenon; and
an intermediate level layer provided on the p-type gallium nitride layer, containing a p-type gallium nitride which contains the p-type impurity at a higher concentration than the p-type gallium nitride layer, having at least one or more intermediate levels between a valence band and a conduction band, and configured to suppress an overcurrent resulting from a breakdown due to the punchthrough phenomenon in the p-type gallium nitride layer.

DETAILED DESCRIPTION OF THE INVENTION

As described above, since a GaN laminate substrate is configured so that a breakdown occurs due to a punchthrough phenomenon before an electrical breakdown occurs due to an avalanche breakdown, an electrical breakdown due to the avalanche breakdown in a semiconductor device may be suppressed, but a durability tends to he low when a reverse voltage is repeatedly applied. The inventors of the present invention have considered a unique problem of such a GaN laminate substrate and focused on an effect of a current (hereinafter referred to as punchthrough current) flows when a reverse bias voltage is applied to a pn-junction and thus a punchthrough phenomenon occurs. In a semiconductor fabricated from a GaN laminate substrate, it is presumed that once an overcurrent is generated due to a punchthrough current, an epi-layer crystal in the GaN laminate substrate is more likely to be damaged compared to a semiconductor fabricated from a Si or SiC laminate substrate. That is, it is presumed that the damage is likely to be accumulated in the crystal when a reverse bias voltage is repeatedly applied and durability tends to be low in the GaN laminate substrate.

The inventors of the present invention have studied various methods for the purpose of suppressing an overcurrent due to a punchthrough in the GaN laminate substrate based on the above presumption. As a result, it is found that a desired durability can be attained when an intermediate level layer is provided on a surface of a p-type GaN layer of the GaN laminate substrate, the intermediate level layer having a higher p-type impurity concentration than the p-type GaN layer and having at least one or more intermediate levels between a valence band and a conduction band. The present invention has been attained based on the above-described findings.

An Embodiment of the Present Invention

Figure 1:
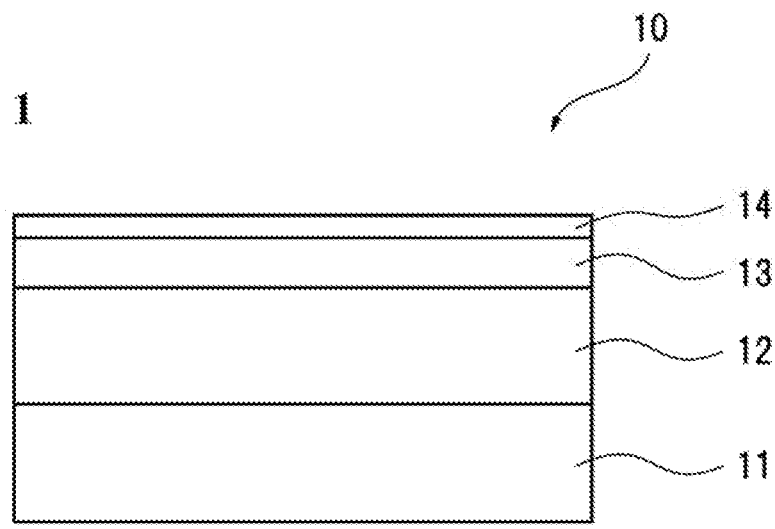
FIG. 1 is a schematic cross-sectional view illustrating a gallium nitride laminated substrate according to an embodiment of the present invention.
Figure 2:
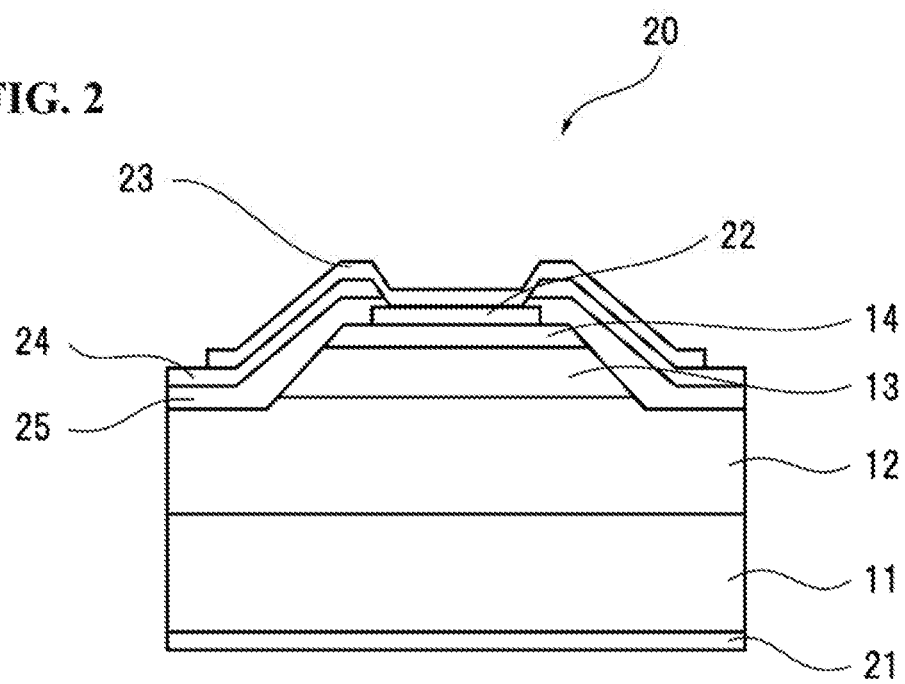
FIG. 2 is a schematic cross-sectional view illustrating a semiconductor device according to an embodiment of the present invention.

Hereafter, a gallium nitride laminated substrate and a semiconductor device according to an embodiment of the present invention will be explained. FIG. 1 is a schematic cross-sectional view illustrating a gallium nitride laminated substrate according to an embodiment of the present invention. FIG. 2 is a schematic cross-sectional view illustrating a semiconductor device according to an embodiment of the present invention.

As illustrated in FIG. 1, a gallium nitride laminated substrate 10 (GaN laminate substrate 10) according to this embodiment includes a GaN substrate 11, and an n-type GaN layer 12, a p-type GaN layer 13, and an intermediate level layer 14 which are laminated on the GaN substrate 11.

The GaN substrate 11 contains an n-type GaN crystal. For example, a GaN crystal is epitaxially grown on an underlayer substrate such as a sapphire substrate, the grown crystal is sliced from the underlayer substrate and the surface is polished to fabricate the GaN substrate 11. As a procedure of growing crystal, any and all known procedure including a vapor phase growth method and a liquid phase growth method may be used. For example, a vapor phase growth method such as a metal organic chemical vapor deposition method (MOCVD method) or a hydride vapor phase epitaxy method (HVPE method), or a void-assisted separation method (VAS method) may be used. The GaN substrate 11 may be, for example, in the form of a disc, and its thickness is not particularly limited so long as the thickness realizes self-standing and may be, for example, 0.4 mm or more and 1.0 mm or less. The concentration of the n-type impurity in the GaN substrate 11 may be, for example, $1.0 \times 10^{18}$ cm$^{-3}$ or more and $1.0 \times 10^{19}$ cm$^{-3}$ or less.

An n-type GaN layer 12 is provided on the GaN substrate 11. The n-type GaN layer 12 contains a gallium nitride which contains an n-type impurity. The conventionally known element such as Si or Ge may be used as the n-type impurity. The concentration of the n-type impurity contained in the n-type GaN layer 12 may be appropriately varied depending on the device characteristics required for the semiconductor device and may be, for example, $1.0 \times 10^{15}$ cm$^{-3}$ or more and $5.0 \times 10^{16}$ cm$^{-3}$ or less. Further, the thickness of the n-type GaN layer 12 may be similarly varied as needed, and may be, for example, 10 μm or more and 40 μm or less.

A p-type GaN layer 13 is provided on the n-type GaN layer 12. The p-type GaN layer 13 contains a gallium nitride which contains a p-type impurity to form a pn-junction at an interface with the n-type GaN layer 12. In this embodiment, the p-type GaN layer 13 has a p-type impurity concentration and a thickness such that a breakdown occurs due to a punchthrough phenomenon before an electrical breakdown occurs by a breakdown due to an avalanche phenomenon. In this p-type GaN layer 13, when a reverse bias voltage is applied to the pn-junction at the interface with the n-type GaN layer 12, a depletion layer formed at the pn-junction is expanded with an increase in the voltage. Thereafter, when the depletion layer is expanded from the interface of the pn-junction and reaches to a surface of the p-type GaN layer 13, a breakdown occurs due to a punchthrough phenomenon, Therefore, a punchthrough current (so-called breakdown current) flows, and an electrical breakdown of the semiconductor device can be prevented from occurring.

Now, a mechanism by which a breakdown occurs due to a punchthrough phenomenon before a breakdown due to an avalanche phenomenon in the p-type GaN layer 13 will be specifically explained. In the following explanations, a breakdown due to an avalanche phenomenon is referred to as an avalanche breakdown, a voltage at which the breakdown occurs is referred to as an avalanche breakdown voltage $V_A$, a breakdown due to a punchthrough phenomenon is referred to as a punchthrough breakdown, and a voltage at which this breakdown occurs is referred to as a punch through breakdown voltage $V_P$.

A conventional GaN laminate substrate is generally configured so that a punchthrough breakdown voltage $V_P$ is excessively higher than an avalanche breakdown voltage $V_A$. For example, it is configured so that $V_P$ is ten times or more of $V_a$. Therefore, a conventional semiconductor device will experience electrical breakdown when a reverse bias voltage is applied thereto because an avalanche breakdown occurs while a punchthrough does not occur.

On the contrary, a p-type GaN layer 13 is configured so that a punchthrough phenomenon occurs and thus a punch through breakdown voltage $V_P$ is not excessively higher than an avalanche breakdown voltage $V_A$ in this embodiment. In such a p-type GaN layer 13, a punchthrough breakdown voltage $V_P$ remains constant regardless of a temperature, while an avalanche breakdown voltage $V_A$ becomes higher with an increase in the temperature. Therefore, it is found that the correlation between $V_A$ and $V_P$ varies with the temperature and a punchthrough phenomenon occurs by a different mechanism.

Specifically, when a temperature of the p-type GaN layer 13 is lower than a predetermined threshold, the avalanche breakdown voltage $V_A$ is equal to or lower than the punchthrough breakdown voltage $V_P$ ($V_A \leq V_P$). In this case, since $V_A \leq V_P$ is generally established, it is thought that an avalanche breakdown is induced in advance, and then an electrical breakdown occurs. In the p-type GaN layer 13, however, the avalanche phenomenon occurs, and subsequently the punchthrough phenomenon is induced, or the punchthrough phenomenon occurs simultaneously with the avalanche phenomenon. In other words, the punchthrough phenomenon occurs at a voltage lower than an original punchthrough breakdown voltage. Therefore, the punchthrough breakdown occurs before the avalanche breakdown.

On the other hand, when the temperature of the p-type GaN layer 13 is the predetermined threshold or more, the avalanche breakdown voltage $V_A$ is higher than the punchthrough breakdown voltage $V_P$ ($V_P < V_A$). In this case, since $V_P < V_A$ is established and thus the punchthrough phenomenon occurs before the avalanche phenomenon, the punch through breakdown occurs before the avalanche breakdown.

As described above, in the p-type GaN layer 13, regardless of a temperature, when a reverse bias voltage is high, the punchthrough phenomenon occurs to prevent an electrical breakdown from occurring.

The reason for induction of the punchthrough phenomena is not clear, but it is presumed as follows. In the p-type GaN layer 13, a hole is generated by applying a reverse bias. Originally, the hole freely moves back and forth between the p-type GaN layer 13, the intermediate level layer 14 and the second electrode 22 by tunneling effect. In this embodiment, however, the hole is accumulated in the p-type GaN layer 13 by applying a reverse bias, and it is presumed that the accumulated holes eventually form a path through which the punchthrough phenomenon occurs.

The above-described temperature threshold is a temperature at which a magnitude relation between the avalanche breakdown voltage and the punchthrough breakdown voltage is reversed. The threshold is not particularly limited but, for example, 110° C. to 130° C.

From the viewpoint of reliably causing an induction of the punchthrough phenomenon at a lower temperature, the punchthrough breakdown voltage ($V_P$) is preferably equal to or lower than twice the avalanche breakdown voltage ($V_A$). In other words, it is preferred that $V_P \leq 2 \times V_A$ is established at a lower temperature. It is more preferred that $V_A$ is comparable with $V_P$.

The conventionally known element such as Mg or Zn may be used as the p-type impurity to be added to the p-type GaN layer 13.

The concentration of the p-type impurity contained in the p-type GaN layer 13 is not particularly limited so long as the breakdown occurs due to the punchthrough phenomenon before the breakdown due to the avalanche phenomenon. From the viewpoint of easy expansion of the depletion layer by applying a reverse bias and reduced punchthrough breakdown voltage, the concentration of the p-type impurity may be reduced. Specifically, the concentration of the p-type impurity is preferably $1 \times 10^{17}$ cm$^{-3}$ or more and $1 \times 10^{18}$ cm$^{-3}$ or less.

From the viewpoint of more reliably causing the punchthrough phenomenon, the p-type GaN layer 13 is preferably configured so that the concentration of the p-type impurity becomes higher toward the intermediate level layer 14 in the thickness direction. For example, the concentration of the p-type impurity may be varied in the thickness direction so that, in the p-type GaN layer 13, the concentration of the p-type impurity is $1.0 \times 10^{17}$ cm$^{-3}$ on the n-type GaN layer 12 side while the concentration of the p-type impurity is $5.0 \times 10^{17}$ cm$^{-3}$ on the intermediate level layer 14 side.

The thickness of the p-type GaN layer 13 is not particularly limited so long as the breakdown occurs due to the punchthrough phenomenon and may be appropriately varied depending on the concentration of the p-type impurity. From the viewpoint of more reliably causing the punchthrough phenomenon, the thickness of the p-type GaN layer 13 may be reduced. Specifically, the thickness of the p-type GaN layer 13 is preferably 700 nm or less, and more preferably 300 nm or more and 700 nm or less.

An intermediate level layer 14 is provided on the p-type GaN layer 13. The intermediate level layer 14 contains the p-type GaN which contains the p-type impurity at a higher concentration than the concentration in the p-type GaN layer 13 and has at least one or more intermediate levels between the valence band and the conduction band. Here, the intermediate level is formed by defects introduced by the p-type impurity into the GaN crystal, lies between the valence band and the conduction band (band gap) in the GaN crystal, and exhibits a level different from the impurity level resulting from the p-type impurity. In the intermediate level layer 14 having one or more intermediate levels, a current amount may be appropriately adjusted so as not to generate an overcurrent when a punchthrough current is generated in the p-type GaN layer 13.

A concentration of the p-type impurity contained in the intermediate level layer 14 is not particularly limited but preferably $5 \times 10^{19}$ cm$^{-3}$ or more from the viewpoint of introducing a plurality of intermediate levels into the intermediate level layer 14 to further suppress an overcurrent. On the other hand, from the viewpoint of maintaining appropriate crystallinity in the intermediate level layer 14, the concentration of the p-type impurity is preferably $1 \times 10^{21}$ cm$^{-3}$ or less.

A thickness of the intermediate level layer 14 is preferably 5 nm or more and 50 nm or less from the viewpoint of further suppressing an overcurrent in the p-type GaN layer 13.

In the intermediate level layer 14, it is preferred that the detects forming the intermediate level are formed so as to be uniform in a plane from the viewpoint of further suppressing an overcurrent in the p-type GaN layer 13.

For example, the GaN laminate substrate 10 according to this embodiment may be fabricated as follows.

First, as a seed crystal substrate, a GaN substrate 11 containing an n-type GaN single crystal is prepared.

Subsequently, an n-type GaN crystal is grown on the GaN substrate 11 by a vapor phase growth method such as a MOCVD method to form an n-type GaN layer 12. Growth conditions of the n-type GaN layer 12 are not particularly limited but, for example, a growth temperature and a growth pressure may be appropriately selected from ranges of 950 to 1,150° C. and 0.02 to 0.08 MPa, respectively.

Subsequently, a p-type GaN crystal is grown on the n-type GaN layer 12 to form a p-type GaN layer 13. In this case, for example, a concentration of a p-type impurity may be reduced or the p-type GaN layer 13 may be formed thinner so that a breakdown occurs due to a punchthrough phenomenon before an avalanche breakdown. For example, the p-type GaN layer 13 is formed so that the thickness is 700 nm or less while the concentration of the p-type impurity is $1 \times 10^{17}$ m$^{-3}$ or more and $1 \times 10^{18}$ m$^{-3}$ or less. Growth conditions of the p-type GaN layer 13 are not particularly limited but, for example, the growth temperature and a growth pressure may be appropriately selected from ranges of 950 to 1,150° C. and 0.02 to 0.08 MPa, respectively.

Subsequently, a p-type GaN crystal is grown on the p-type GaN layer 13 to form an intermediate level layer 14, the p-type GaN crystal having higher concentration of the p-type impurity than the p-type GaN layer 13. In the intermediate level layer 14, since the p-type impurity is contained at relatively higher concentration, defects derived from the impurity may be formed in the GaN crystal to introduce an intermediate level. Growth conditions of the intermediate level layer 14 are not particularly limited so long as they may increase the concentration of the p-type impurity but, for example, the growth temperature and a growth pressure may be appropriately selected from ranges of 950 to 1,150° C. and 0.02 to 0.08 MPa, respectively.

Thus the GaN laminate substrate 10 according to this embodiment is Obtained.

The obtained GaN laminate substrate 10 may be subjected to annealing process in order to activate a p-type impurity contained in the p-type GaN crystal, as needed. The annealing process may involve, for example, heat treatment at 450° C. for 30 minutes in a nitrogen atmosphere.

As illustrated in FIG. 2, the n-type GaN layer 12, the p-type GaN layer 13 and the intermediate level layer 14 of the above-described GaN laminate substrate 10 are processed into a mesa structure having a top surface and side surfaces, with which is then provided electrodes 21, 22 and an insulating film 24 to fabricate the semiconductor device 20 according to this embodiment.

On a surface on the GaN substrate 11 side of the GaN laminate substrate 10 is provided a first electrode 21. The first electrode 21 is not particularly limited so long as it can be connected to the GaN substrate 11 by an ohmic connection and, for example, a metal film including laminated Ti and Al layers may be used.

On a surface on the intermediate level layer 14 side of the GaN laminate substrate 10 is provided a second electrode 22. The second electrode 22 is not particularly limited so long as it can be connected to the intermediate level layer 14 by an ohmic connection and, for example, a metal film including laminated Pd and Ni layers may be used. As illustrated in FIG. 2, a field plate electrode 23 may be provided on the second electrode 22 in order to control a surface charge distribution.

In the mesa structure of the GaN laminate substrate 10, an insulating film 24 is provided to cover its side surface portions and a part of the top surface with an intervening spin-on glass layer 25. The insulating film 24 is formed, for example, using $SiO_2$. The spin-on glass layer 25 may be provided for the purpose of flattening the irregularities in the area on which the insulating film 24 to be formed. For example, liquid $SiO_2$ may be applied by spin coating and the resultant is subjected to heat treatment to form the spin-on glass layer 25.

The semiconductor device 20 according to this embodiment can be used, for example, as a power control element, surge absorber or the like for a hybrid car or a train.

Effect According to this Embodiment

According to this embodiment, one or more effects shown below may be obtained.

The GaN laminate substrate 10 according to this embodiment is configured to include an n-type GaN layer 12, a p-type GaN layer 13 and an intermediate level layer 14 laminated one another; the p-type GaN layer 13 having a p-type impurity concentration and a thickness such that the breakdown occurs due to the punchthrough phenomenon before the breakdown due to the avalanche phenomenon; and the intermediate level layer 14 containing the p-type impurity at a concentration higher than the concentration in the p-type GaN layer 13 and having the intermediate level. The semiconductor device 20 fabricated from such a GaN laminate substrate 10 hardly experiences an electrical breakdown since a punchthrough current (breakdown current) flows by a punchthrough breakdown before an avalanche breakdown when a reverse bias voltage is applied to a pn-junction. In addition, since the semiconductor device 20 has an intermediate level layer 14 between the p-type GaN layer 13 and the second electrode 22, it hardly experiences an electrical breakdown even if a reverse bias voltage is repeatedly applied to the pn-junction and thus it has an excellent durability.

Specifically, the semiconductor device 20 has a durability which prevents an electrical breakdown from occurring even if the reverse bias voltage is repeatedly applied to the pn-junction to cause a breakdown, as shown in Example 1 below. Breakdown used herein is caused by a punchthrough phenomenon and means a case where a current with a current value of 1 μA or more is generated by applying a reverse bias voltage.

A mechanism by which a durability is enhanced by the intermediate level layer 14 is considered as follows. The intermediate level layer 14 has in a band gap at least one intermediate level different from the impurity level. The intermediate level may let an electron or hole hop and thereby leak a current as needed. Accordingly, the intermediate level layer 14 may let a current leak from the p-type GaN layer 13 and thereby suppress an overcurrent, when a reverse bias voltage is applied to the semiconductor device 20 to generate a punchthrough phenomenon and thereby to let a punchthrough current flow through the p-type GaN layer 13. Therefore, a damage inflicted on the GaN crystal by the overcurrent in the p-type GaN layer 13 can be suppressed and a durability of the semiconductor device 20 can be improved.

The concentration of the p-type impurity in the intermediate level layer 14 is preferably $5.0 \times 10^{19}$ cm$^{-3}$ or more and $1.0 \times 10^{21}$ cm$^{-3}$ or less. It is sufficient for the impurity concentration in the intermediate level layer 14 to be lower than $5.0 \times 10^{19}$ cm$^{-3}$ from the viewpoint of an ohmic connection with the second electrode 22. In this case, however, the density of the defect derived from the impurity is low and the intermediate level tends to be hardly formed. Since an excessive amount of the p-type impurity at the impurity concentration of $5.0 \times 10^{19}$ cm$^{-3}$ or more is added, defects can be formed in the GaN crystal at an appropriate density. As a result, the intermediate level can he introduced. On the other hand, since the impurity concentration is $1.0 \times 10^{21}$ cm$^{-3}$ or less to obtain an appropriate defect density, the crystal structure of the GaN crystal in the intermediate level layer 14 can be appropriately maintained.

The thickness of the intermediate level layer 14 is preferably 5 nm or more and 50 nm or less. When the intermediate level layer 14 is formed excessively thin or thick, the crystallinity of the GaN crystal will he deteriorated and the intermediate level will be hardly formed. When it is formed to have a thickness of 5 nm or more and 50 nm or less, the crystal structure of the GaN crystal can be appropriately maintained while suppressing the excessive generation of the defects derived from the impurity and keeping the defect density in an appropriate range in the intermediate level layer 14.

The concentration of the p-type impurity in the p-type GaN layer 13 is preferably $1.0 \times 10^{17}$ cm$^{-3}$ or more and $1.0 \times 10^{18}$ cm$^{-3}$ or less. Moreover, the p-type GaN layer 13 is preferably configured such that the concentration of the p-type impurity becomes higher toward the intermediate level layer 14 in the thickness direction. The thickness of the p-type GaN layer 13 is preferably 700 nm or less. With the p-type GaN layer 13 having such an impurity concentration and a thickness, the depletion layer will more easily reach the surface and more reliably cause a punchthrough when a reverse bias voltage is applied to the pn-junction.

The intermediate level layer 14 preferably has a configuration such that the defect forming the intermediate level is uniform in a plane. Accordingly, the intermediate level layer 14 can let the punchthrough current uniformly leak in the plane and thus more reliably suppress an overcurrent in the p-type GaN layer 13.

Further, the punchthrough breakdown voltage is preferably equal to or lower than twice the avalanche breakdown voltage in the GaN laminate substrate 10. In the GaN laminate substrate 10, a punchthrough phenomenon can be more reliably induced at a relatively lower temperature from the occurrence of the avalanche phenomenon. Accordingly, a breakdown can occur due to a punchthrough phenomenon before a breakdown due to an avalanche phenomenon irrespective of a temperature range to suppress an electrical breakdown.

On the other hand, a conventional GaN laminate substrate as a comparative embodiment is generally designed so that a punchthrough breakdown voltage is excessively higher than an avalanche breakdown voltage. For example, the punchthrough breakdown voltage is ten times or more of the avalanche breakdown voltage. In a semiconductor device fabricated from the conventional GaN laminate substrate, even when a reverse bias is applied and an avalanche phenomenon begins to occur, a punchthrough phenomenon is not induced. Consequently, an avalanche breakdown occurs and thus an electrical breakdown occurs.

<Variation>

In the above-described embodiments, a vertical semiconductor device is explained as an example, but the present invention is not limited thereto. A GaN laminate substrate may be formed with a source electrode and a drain electrode apart from each other on the intermediate level layer to configure a horizontal semiconductor.

The present invention has been explained with reference to embodiments and variations thereof, but the present invention is not limited to them. For example, it will be apparent to those skilled in the art that various modifications, improvements, combinations, and the like can be made.

EXAMPLES

Now, the present invention will be described in more detail based on examples, but the present invention is not limited to these examples.

Example 1

In this example, a GaN laminate substrate 10 was fabricated having a structure illustrated in FIG. 1 using a MOVPE method. Specifically, an n-type GaN layer 12 doped with Si as an n-type impurity, a p-type GaN layer 13 doped with Mg as a p-type impurity, and an intermediate level layer 14 doped with Mg at a concentration higher than the concentration in the p-type GaN layer are grown sequentially on an n-type GaN substrate 11 under the above-described growth conditions. In this example, an n-type GaN layer 12 was grown such that a thickness was 30 μm and an n-type impurity concentration fell within a range from $1.05 \times 10^{16}$ to $2.0 \times 10^{15}$. A p-type GaN layer 13 was grown such that a thickness was 500 nm and a p-type impurity concentration was $2.0 \times 10^{17}$ cm$^{-3}$. An intermediate level layer 14 was grown such that a thickness was 30 nm and a p-type impurity concentration was $2.0 \times 10^{20}$ cm$^{-3}$. Subsequently, after each of the layers was grown, annealing was conducted under N$_2$ atmosphere at 850° C. for 30 minutes to activate the p-type impurity (Mg). Thus a GaN laminate substrate according to Example 1 was fabricated.

Then, a semiconductor device having a structure illustrated in FIG. 2 was fabricated from a GaN laminated substrate.

Specifically, Ni was vapor-deposited on a GaN laminate substrate by an EB vapor deposition method, a pattern for mesa etching was formed by a lift-off method, and GaN etching was conducted using this pattern as a mask. The etching was conducted by an Inductive Coupled Plasma-Reactive Ion Etching (ICP-RIE) method. As a reactant gas, a mixed gas of CF$_4$ and Ar was used.

Subsequently, Pd/Ni was vapor-deposited by an EB vapor deposition method, and a p-type ohmic electrode (anode electrode) was formed by a lift-off method.

Subsequently, SOG and SiO$_2$, which were surface protective films, were formed on the entire surface. SOG was formed by application followed by annealing on a hot plate at 120° C. for 5 minutes and 350° C. for 30 minutes. SiO$_2$ was formed using a sputtering method.

Subsequently, a mask pattern for processing SOG and SiO$_2$ was formed, and SOG and SiO$_2$ were processed by a dry etching method. Photosensitive polyimide was used as a mask pattern for processing, Formation conditions involved: after application, baking at 120° C. for 5 minutes, exposing and developing, and then baking at 150° C. for 5 minutes and at 200° C. for 30 minutes. An ICP-RIE method vas used for dry etching. Etching conditions were as described above. After dry etching, the ICP-RIE method was used again to remove polyimide which was a mask. O$_2$ was used as a reactant gas.

Subsequently, Ti/Al was vapor-deposited by an EB vapor deposition method, and a field plate electrode (FP electrode) was formed by a lift-off method.

Finally, Ti/Al was vapor-deposited on a backside by an EB vapor deposition method to form an n-type ohmic electrode (cathode). Thus a semiconductor device according to Example 1 was fabricated.

In this example, the durability of the fabricated semiconductor device was evaluated according to the following method. Specifically, a current value was measured while a voltage from 0 V to 5 kV was applied between the cathode electrode and the anode electrode so that the cathode electrode side was positive. In this example, the measurement was repeated 15 times.

Figure 3:
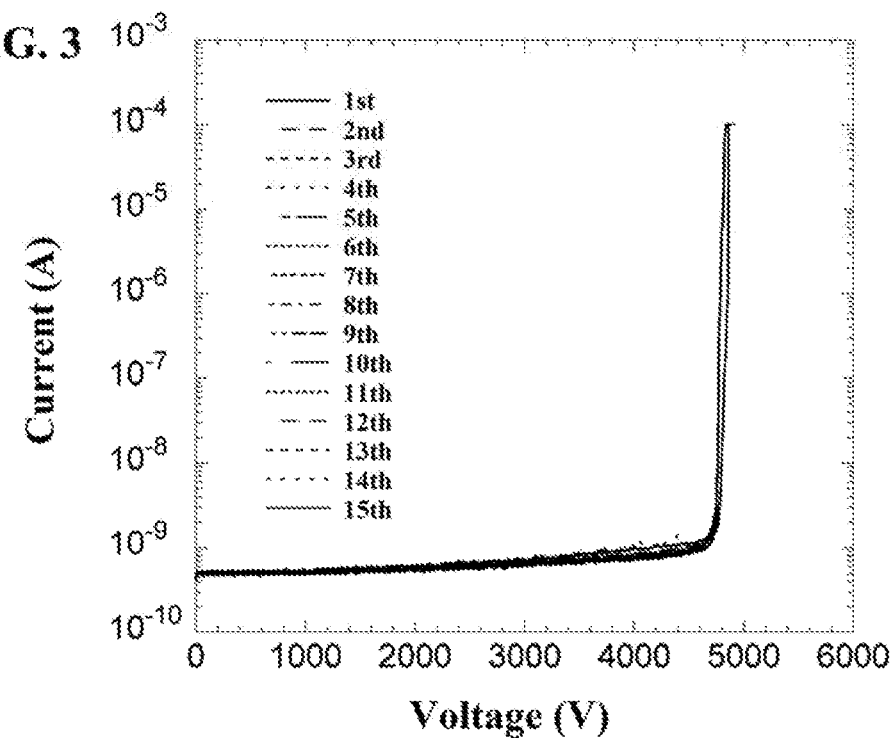
FIG. 3 illustrates IV characteristics when a reverse bias is applied to a semiconductor device according to Example 1.

Consequently, the results as illustrated in FIG. 3 were obtained for the semiconductor device according to Example 1. FIG. 3 illustrates IV characteristics when a reverse bias is applied to a semiconductor device according to Example 1. In the figure, the horizontal axis represents a reverse bias voltage [V], and the vertical axis represents a current value [A] when a voltage is applied. According to FIG. 3, it was confirmed that an electrical breakdown did not occur in the semiconductor device according to Example 1 even when a high voltage was applied 15 times. It was also confirmed that the current value at the reverse bias voltage of 4.5 kV or more was $10^4$ times or more of the current value at the voltage of lower than 4.5 kV. In other words, it was confirmed that, in the semiconductor device according to Example 1, GaN crystal was hardly damaged even when a current value became higher at a high voltage and hardly experienced an electrical breakdown when a voltage was repeatedly applied. It is considered because, in the semiconductor device, the intermediate level layer let a punchthrough current leak when the current was generated by applying a high voltage and thus a damage in the GaN crystal due to an overcurrent was able to be suppressed in the p-type GaN layer 13.

Figure 4:
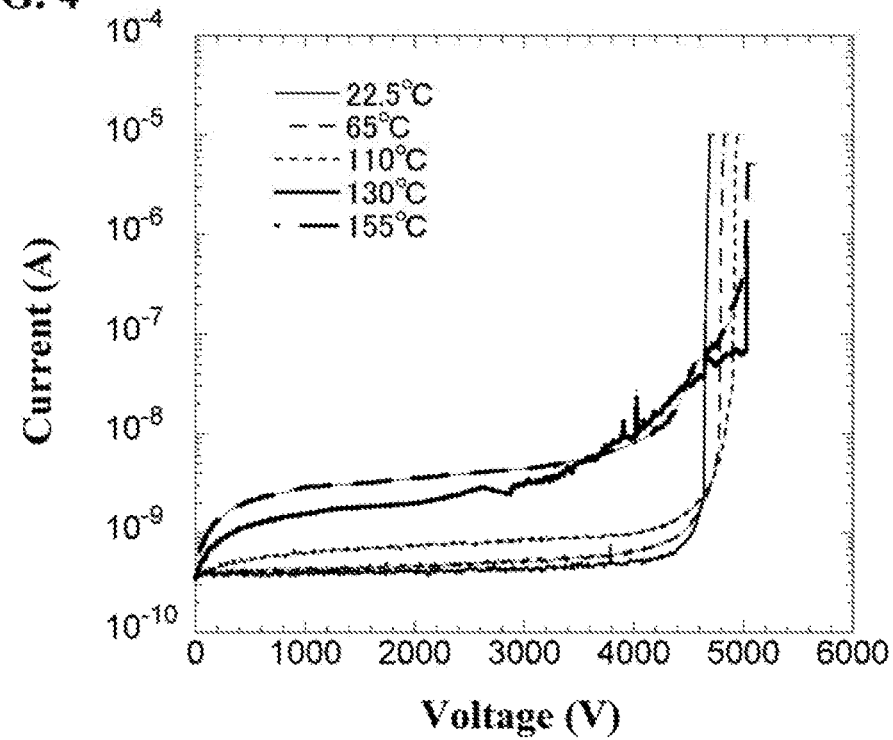
FIG. 4 illustrates a temperature dependence of IV characteristics when a reverse bias is applied to a semiconductor device according to Example 1 while varying a temperature.

A semiconductor device according to Example 1 was evaluated for a temperature dependence of IV characteristics, and the results illustrated in FIG. 4 were obtained. FIG. 4 illustrates IV characteristics when a reverse bias was applied to a semiconductor device according to Example 1 while varying a temperature. As in FIG. 3, the horizontal axis represents a reverse bias voltage [V] and the vertical axis represents a current value [A] when a voltage is applied. According to FIG. 4, it was confirmed that the current value tended to become higher as the temperature of the semiconductor device increased. It was also confirmed that since a breakdown eventually occurred due to a punchthrough phenomenon regardless of a temperature, an electrical breakdown was able to be suppressed. According to FIG. 4, it was also confirmed that, in a semiconductor device according to Example 1, an avalanche breakdown voltage $V_A$ was 4.7 kV and a punchthrough breakdown voltage $V_P$ was 5.1 kV. Namely, it was confirmed that $V_P$ was equal to 1.09 times of $V_A$ and equal to or lower than twice $V_A$.

Comparative Example 1

Figure 5:
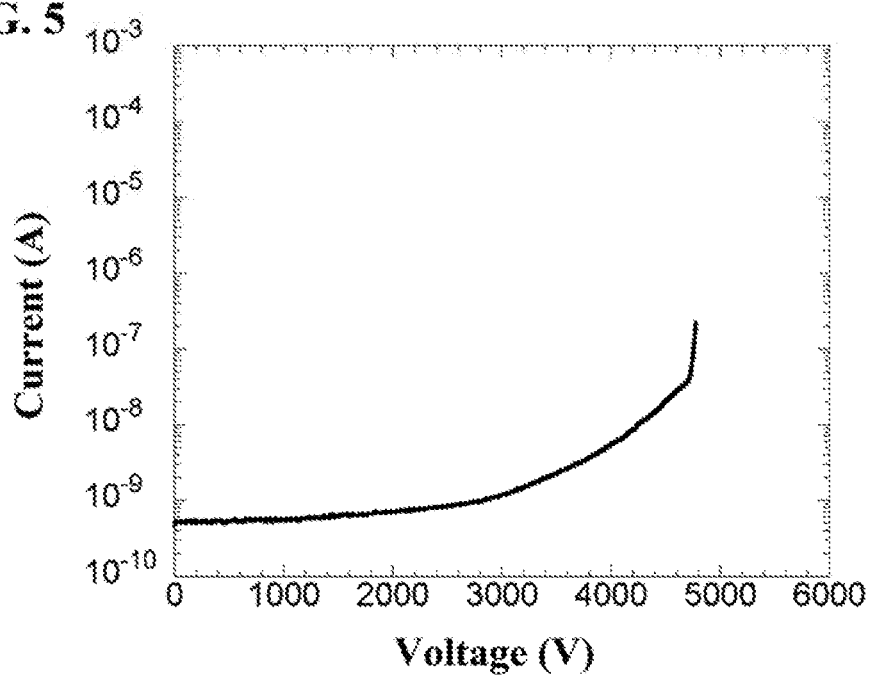
FIG. 5 illustrates IV characteristics when a reverse bias is applied to a semiconductor device according to Comparative Example 1.

In Comparative Example 1, a GaN laminate substrate and a semiconductor device were fabricated in the same manner as in Example 1, except that, after an n-type GaN layer was grown on a GaN substrate as in Example 1, a p-type GaN layer having a p-type impurity concentration of $2.0\times10^{17}$ cm$^{-3}$ and a p+-type GaN layer having a p-type impurity concentration of $1.0\times10^{19}$ cm$^{-3}$, which was higher than the concentration in the p-type GaN layer, were sequentially grown on the n-type GaN layer. In the same manner as in Example 1, durability was evaluated to obtain the results illustrated in FIG. 5. As shown in FIG. 5, it was confirmed that an electrical breakdown occurred when a voltage was increased in the semiconductor device according to Comparative Example 1. In Comparative Example 1, it is considered since a p+-GaN layer which had no intermediate level was provided on the p-type GaN layer, an overcurrent was generated when a voltage was increased, which inflicted damage on the GaN crystal, resulting in an electrical breakdown. In the semiconductor device according to Comparative Example 1, it was confirmed that an avalanche breakdown voltage $V_A$ was 4.8 kV. Although a punchthrough breakdown voltage $V_P$ was not able to be actually measured, it was confirmed that $V_P$ was 50 kV or more and higher than ten times of $V_A$ from the constitution of Comparative Example 1.

<Preferred Aspect of the Present Invention>

Hereinafter, supplementary descriptions of the preferred aspects of the present invention will be given.

(Supplementary Description 1)

According to an aspect of the present invention, there is provided a gallium nitride laminated substrate including:

an n-type gallium nitride layer containing an n-type impurity;

a p-type gallium nitride layer provided on the n-type gallium nitride layer, containing a p-type impurity, forming a pn-junction at an interface with the n-type gallium nitride layer, and having a p-type impurity concentration and a thickness such that, when a reverse bias voltage is applied to the pn-junction, a breakdown occurs due to a punchthrough phenomenon before occurrence of a breakdown due to an avalanche phenomenon; and an intermediate level layer provided on the p-type gallium nitride layer, containing a p-type gallium nitride which contains the p-type impurity at a higher concentration than the p-type gallium nitride layer, having at least one or more intermediate levels between a valence band and a conduction band, and configured to suppress an overcurrent resulting from a breakdown due to the punchthrough phenomenon in the p-type gallium nitride layer.

(Supplementary Description 2)

The gallium nitride laminated substrate according to supplementary description 1, wherein preferably the concentration of the p-type impurity in the intermediate level layer is $5\times10^{19}$ cm$^{-3}$ or more.

(Supplementary Description 3)

The gallium nitride laminated substrate according to supplementary description 1 or 2, wherein preferably a thickness of the intermediate level layer is 5 nm or more and 50 nm or less.

(Supplementary Description 4)

The gallium nitride laminated substrate according to supplementary descriptions 1 to 3, wherein preferably an avalanche breakdown voltage is $V_A$ when the breakdown occurs due to the avalanche phenomenon, and a punchthrough breakdown voltage is $V_P$ when the breakdown occurs due to the punchthrough phenomenon, and in this case, $V_A \leq V_P$ is established when a temperature is lower than a predetermined threshold value, and the punchthrough phenomenon is induced due to the occurrence of the avalanche phenomenon, or the punchthrough phenomenon occurs simultaneously with the avalanche phenomenon, and $V_A > V_P$ is established when the temperature is a predetermined threshold value or more, and the punchthrough phenomenon occurs before the avalanche phenomenon, and therefore the breakdown occurs due to the punchthrough phenomenon before the breakdown due to the avalanche phenomenon.

(Supplementary Description 5)

The gallium nitride laminated substrate according to supplementary description 4, wherein preferably the punchthrough breakdown voltage is equal to or lower than twice the avalanche breakdown voltage.

(Supplementary Description 6)

The gallium nitride laminated substrate according to supplementary description 4 or 5, wherein preferably predetermined threshold is 110° C. or more and 130° C. or less.

(Supplementary Description 7)

The gallium nitride laminated substrate according to supplementary descriptions 1 to 6, wherein preferably the p-type impurity concentration in the p-type gallium nitride layer is $1\times10^{17}$ cm$^{-3}$ or more and $1\times10^{18}$ cm$^{-3}$ or less.

(Supplementary Description 8)

The gallium nitride laminated substrate according to supplementary descriptions 1 to 7, wherein preferably the p-type gallium nitride layer is configured such that a p-type impurity concentration becomes higher toward the intermediate level layer in the thickness direction.

(Supplementary Description 9)

The gallium nitride laminated substrate according to supplementary descriptions 1 to 8, wherein preferably a thickness of the p-type gallium nitride layer is 700 nm or less.

(Supplementary Description 10)

The gallium nitride laminated substrate according to supplementary descriptions 1 to 9, wherein preferably the intermediate level is formed by defects having been introduced into the gallium nitride by the p-type impurity.

(Supplementary Description 11)

The gallium nitride laminated substrate according to supplementary descriptions 1 to 10, wherein preferably the intermediate level layer is configured such that the defect forming the intermediate level is uniform in a plane.

(Supplementary Description 12)

According to another aspect of the present invention, there is provided a semiconductor device including:

an n-type gallium nitride layer containing an n-type impurity;

a p-type gallium nitride layer provided on the n-type gallium nitride layer, containing a p-type impurity, forming a pn-junction at an interface with the n-type gallium nitride layer, and having a p-type impurity concentration and a thickness such that, when a reverse bias voltage is applied to the pit-junction, a breakdown occurs due to a punchthrough phenomenon before occurrence of a breakdown due to an avalanche phenomenon; and an intermediate level layer provided on the p-type gallium nitride layer, containing a p-type gallium nitride which contains the p-type impurity at a higher concentration than the p-type gallium nitride layer, having at least one or more intermediate levels between a valence band and a conduction band, and configured to suppress an overcurrent resulting from a breakdown due to the punchthrough phenomenon in the p-type gallium nitride layer.

(Supplementary Description 13)

According to still another embodiment of the present invention, there is provided a semiconductor device including a gallium nitride laminated substrate having a pn-junction, and having a durability a prevents an electrical breakdown from occurring even when a reverse bias voltage is repeatedly applied which causes the breakdown, wherein the breakdown means a case where a current with a current value of 1 μA or more is generated by applying a reverse bias voltage to the pn-junction.

DESCRIPTIONS OF SIGNS AND NUMERALS

10 Gallium nitride laminated substrate
11 Gallium nitride substrate
12 n-type gallium nitride layer
13 p-type gallium nitride layer
14 Intermediate level layer
20 Semiconductor device
21 First electrode
22 Second electrode
23 Field plate electrode
24 Insulating film
25 Spin-on glass layer

What is claimed is:

1. A gallium nitride laminated substrate comprising:
an n-type gallium nitride layer containing an n-type impurity;
a p-type gallium nitride layer provided on the n-type gallium nitride layer, containing a p-type impurity, forming a pn-junction at an interface with the n-type gallium nitride layer, and having a p-type impurity concentration and a thickness such that, when a reverse bias voltage is applied to the pn-junction, a breakdown occurs due to a punchthrough phenomenon before occurrence of a breakdown due to an avalanche phenomenon; and
an intermediate level layer provided on the p-type gallium nitride layer, containing a p-type gallium nitride which contains the p-type impurity at a higher concentration than the p-type gallium nitride layer, having at least one or more intermediate levels between a valence band and a conduction hand, and configured to suppress an overcurrent resulting from a breakdown due to the punchthrough phenomenon in the p-type gallium nitride layer.

2. The gallium nitride laminated substrate according to claim 1, wherein the p-type impurity concentration in the intermediate level layer is $5.0 \times 10^{19}$ $cm^{-3}$ or more.

3. The gallium nitride laminated substrate according to claim 1, wherein a thickness of the intermediate level layer is 5 nm or more and 50 nm or less.

4. The gallium nitride laminated substrate according to claim 1,
wherein an avalanche breakdown voltage is $V_A$ when the breakdown occurs due to the avalanche phenomenon, and a punchthrough breakdown voltage is $V_P$ when the breakdown occurs due to the punchthrough phenomenon, and in this case,
$V_A \leq V_P$ is established when a temperature is lower than a predetermined threshold value, and the punchthrough phenomenon is induced due to the occurrence of the avalanche phenomenon, or the punchthrough phenomenon occurs simultaneously with the avalanche phenomenon, and
$V_A > V_P$ is established when the temperature is a predetermined threshold value or more, and the punchthrough phenomenon occurs before the avalanche phenomenon, and therefore
the breakdown occurs due to the punchthrough phenomenon before the breakdown due to the avalanche phenomenon.

5. The gallium nitride laminated substrate according to claim 4, wherein the punchthrough breakdown voltage is equal to or lower than twice the avalanche breakdown voltage.

6. The gallium nitride laminated substrate according to claim 4, wherein the predetermined threshold is 110° C. or more and 130° C. or less.

7. The gallium nitride laminated substrate according to claim 1, wherein the p-type impurity concentration in the p-type gallium nitride layer is $1.0 \times 10^{17}$ $cm^{-3}$ or more and $1.0 \times 10^{18}$ $cm^{-3}$ or less.

8. The gallium nitride laminated substrate according to claim 1, wherein the p-type gallium nitride layer is configured such that a p-type impurity concentration becomes higher toward the intermediate level layer in the thickness direction.

9. The gallium nitride laminated substrate according to claim 1, wherein a thickness of the p-type gallium nitride layer is 700 nm or less.

10. The gallium nitride laminated substrate according to claim 1, wherein the intermediate level is formed by defects having been introduced into the gallium nitride by the p-type impurity.

11. The gallium nitride laminated substrate according to claim 1, wherein the intermediate level layer is configured such that the defect forming the intermediate level is uniform in a plane.

12. A semiconductor device comprising:

an n-type gallium nitride layer containing an n-type impurity;

a p-type gallium nitride layer provided on the n-type gallium nitride layer, containing a p-type impurity, forming a pn-junction at an interface with the n-type gallium nitride layer, and having a p-type impurity concentration and a thickness such that, when a reverse bias voltage is applied to the pn-junction, a breakdown occurs due to a punchthrough phenomenon before occurrence of a breakdown due to an avalanche phenomenon; and an intermediate level layer provided on the p-type gallium nitride layer, containing a p-type gallium nitride which contains the p-type impurity at a higher concentration than the p-type gallium nitride layer, having at least one or more intermediate levels between a valence band and a conduction band, and configured to suppress an overcurrent resulting from a breakdown due to the punchthrough phenomenon in the p-type gallium nitride layer.

13. The semiconductor device according to claim 12, wherein the semiconductor has a durability that prevents an electrical breakdown from occurring even if the reverse bias voltage which causes a breakdown is repeatedly applied, wherein the breakdown means a case where a current with a current value of 1 µA or more is generated by applying a reverse bias voltage to the pn-junction.

* * * * *

UNITED STATES PATENT AND TRADEMARK OFFICE
CERTIFICATE OF CORRECTION

Page 1 of 1

PATENT NO. : 10,998,188 B2
APPLICATION NO. : 16/403859
DATED : May 4, 2021
INVENTOR(S) : Tomoyoshi Mishima It is certified that error appears in the above-identified patent and that said Letters Patent is hereby corrected as shown below:

In the Specification

Column 1, Line 21, "a pn-j unction, when" should read -- a pn-junction, when --

Column 2, Line 29, "on the Hype gallium" should read -- on the p-type gallium --

Column 3, Line 21, "flows when a reverse" should read -- which flows when a reverse --

Column 6, Line 45, "detects forming the intermediate" should read -- defects forming the intermediate --

Column 7, Line 23, "treatment at 450°" should read -- treatment at 850° --

Column 8, Line 54, "can he formed in the GaN" should read -- can be formed in the GaN --

Column 8, Line 55, "level can he introduced." should read -- level can be introduced. --

Column 10, Line 40, "method vas used" should read -- method was used --

Column 12, Line 61, "wherein preferably predetermined" should read -- wherein preferably the predetermined --

Column 13, Line 33, "the pit-junction, a breakdown" should read -- the pn-junction, a breakdown --

In the Claims

Column 14, Line 19, Claim 1: "and a conduction hand, and" should read -- and a conduction band, and --

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*